United States Patent [19]
Takeshima

[11] Patent Number: 6,154,110
[45] Date of Patent: *Nov. 28, 2000

[54] GRADIENT MAGNETIC FIELD COIL AND MAGNETIC RESONANCE IMAGING APPARATUS USING THE SAME

[75] Inventor: Hirotaka Takeshima, Ryugasaki, Japan

[73] Assignee: Hitachi Medical Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/815,843

[22] Filed: Mar. 12, 1997

[30] Foreign Application Priority Data

Mar. 29, 1996 [JP] Japan ..................... 8-099670

[51] Int. Cl.⁷ ....................................... H01F 5/00
[52] U.S. Cl. ........................... 335/299; 335/296
[58] Field of Search .................... 335/296, 299, 335/216; 324/318–322; 505/599

[56] References Cited

U.S. PATENT DOCUMENTS 4,794,338 12/1988 Roemer et al. ................ 335/299
5,132,618 7/1992 Sugimoto ....................... 327/318
5,448,214 9/1995 Laskaris ........................ 335/301
5,581,187 12/1996 Pausch .

*Primary Examiner*—Lincoln Donovan
*Attorney, Agent, or Firm*—Antonelli, Terry, Stout & Kraus, LLP

[57] ABSTRACT

A gradient magnetic field coil for use in a magnetic resonance imaging apparatus having a magnet for generating a homogeneous magnetic field area by a magnetic field from a magnetic field generation source accommodated in a cooling container and generating a static magnetic field in a predetermined direction includes a substantially flat coil group so extending as to orthogonally cross the direction of the magnetic field of the homogeneous magnetic field area, and the coil group includes a main coil for primarily generating a gradient magnetic field in the homogeneous magnetic field and a shield coil disposed between the main coil and the cooling container, for generating a magnetic field which substantially cancels the magnetic field generated at outside portions of the main coil close to the cooling container to zero. A gradient magnetic coil for use in a magnetic resonance imaging apparatus has a coil group including a main coil for primarily generating a gradient magnetic field and a shield coil disposed between the main coil and the cooling container, two sets of the cooling containers are so disposed as to oppose each other in the direction of the homogeneous magnetic field, and the coil group is provided to each of the two sets of cooling containers.

16 Claims, 8 Drawing Sheets

GRADIENT MAGNETIC FIELD COIL AND MAGNETIC RESONANCE IMAGING APPARATUS USING THE SAME

BACKGROUND OF THE INVENTION

This invention relates to a gradient magnetic field coil which will be suitable for a magnetic resonance imaging apparatus. More specifically, in a gradient magnetic field coil to be used in combination with an open type superconducting magnet having a large aperture, this invention relates to a gradient magnetic field coil which can reduce an eddy current developing in a conductor in the proximity of the gradient magnetic field coil and can provide feeling of openness.

FIGS. 9 and 10 of the accompanying drawings show a first prior art example of a gradient magnetic field coil. These drawings depict the construction of a gradient magnetic field coil used for a horizontal field system superconducting magnet. The coil for the MR apparatus having the construction shown in FIGS. 9 and 10 is described, for example, in Japanese Patent Application laid-open No. JP-A-2-114942 filed in Japan as a Convention Priority application based on U.S. patent application Ser. No. 234,729 filed on Aug. 22, 1988. FIG. 9 is a sectional view of the superconducting magnet and FIG. 10 is an appearance view of the gradient magnetic field coil 2. Referring to FIG. 9, the superconducting magnet 1 generates a magnetic field in a horizontal direction (Z axis direction). Since the coil of the magnet uses a superconducting wire material, cooling must be made to a predetermined temperature (to a liquid helium temperature (4.2° K) in the case of an alloy type superconductor and from a liquid nitrogen temperature (77° K to 10° K) in the case of an oxide type superconductor, for example). For this reason, the superconducting coil 41 is held inside a cooling container 3 comprising a vacuum vessel 3A and a cooling medium vessel 4 (a liquid helium vessel in FIG. 9).

In this prior art example, the gradient magnetic field coil 2 is constituted into a set of cylinders and generates gradient magnetic fields in X, Y and Z three directions orthogonally crossing one another in match with a three-dimensional space. To restrict an eddy current developing in a conductor (more concretely, the vacuum vessel 3A and a heat shield material (not shown) of the superconducting magnet) in the proximity of the gradient magnetic field coil 2, the gradient magnetic field coil 2 has been generally constituted in recent years by disposing coaxially a main coil 6 and a shield coil 7 in the case of a horizontal field system superconducting magnet. The main coil 6 primarily generates a predetermined gradient magnetic field in a homogeneous magnetic field area 5, and the shield coil 7 generates a magnetic field in the opposite direction to that of the main coil 6, so that the intensity of the magnetic field generated at the outside portion of the gradient magnetic field coil 2 can be reduced. Due to this operation, the occurrence of the eddy current in the proximate conductor can be effectively restricted. A subject is placed into the homogeneous magnetic field area 5.

In the construction shown in FIG. 9, however, the measurement space for accepting the subject for imaging is small as can be appreciated from the drawing. Further, because the subject is completely surrounded, the subject is obsessed with feeling of confinement and in some case, refuses to enter the space, and access to the subject from outside the apparatus is difficult.

FIGS. 11, 12A and 12B show the gradient magnetic field coil according to the second prior art example. This example uses an opposed type magnetic circuit using a permanent magnet in place of the superconducting magnet. FIG. 11 is an appearance view of the magnet as a whole and FIGS. 12A and 12B are an appearance view of the peripheral portion of the gradient magnetic field coil and a sectional view. As shown in FIG. 11, four sides are open in this example. The gradient magnetic field coil 2 used for this magnetic circuit is accommodated in a pole piece 9 constituting the magnetic circuit as shown in the drawing in most cases. This arrangement is important in order to limit the production cost of the magnetic circuit.

As described with reference to the horizontal field system superconducting magnet shown in FIGS. 9 and 10, therefore, the technology for restricting the eddy current cannot be applied to the permanent magnet system shown in FIGS. 11 and 12. For, in order to allow the shield coil to effectively operate, a certain distance must be secured between the shield coil and the main coil and in consequence, the main coil cannot be accommodated in the pole piece. As a result, the effective space for the subject is limited by the gap between the upper and lower gradient magnetic field coils opposing each other, becomes narrow and imparts the feeling of confinement to the subject.

The gradient magnetic field coil of the permanent magnet system shown in FIGS. 11, 12A and 12B is described, for example, in JP-A-63-65848.

In the case of the example shown in FIGS. 11, 12A and 12B, a technology of preventing the occurrence of the eddy current even when the gradient magnetic field is energized has been established by using a material having a high electric resistivity as the blank of the pole piece 9.

However, it is difficult to obtain a high magnetic field intensity in the case of the magnetic circuit using the permanent magnet 8 and about 0.3 Tesla is its upper limit. Since image quality of the magnetic resonance imaging apparatus greatly depends on the magnetic field intensity, it is preferred to obtain the highest possible magnetic field intensity to improve image quality.

FIGS. 13A and 14B show the gradient magnetic field coil according to the third prior art example. This example deals with the gradient magnetic field coil for use in a superconducting type opposed magnetic circuit, and is disclosed in U.S. Pat. No. 5,378,989.

FIG. 13A is an appearance view of a horizontal field type magnetic resonance imaging apparatus using the coil of the third prior art example, FIG. 13B is a sectional view on the plane taken along a line XIIB-XIIB' of FIG. 13A, and FIG. 14 is an appearance view of the gradient magnetic field coil. The example shown in these drawings uses a superconducting magnet 1 so as to obtain a high magnetic field intensity and openness, and has an open construction analogous to the permanent magnet system (a construction having a gap or a space at the center portion of a cylinder). In FIGS. 13A and 13B, the subject is loaded into an imaging area (homogeneous magnetic field area) at the center of the apparatus in the X or Z direction. Since the side surfaces of the imaging area 5 are open, the subject is released from the feeling of confinement. The operator of the apparatus or a doctor can get an easy access to the subject, and monitor of surgery is also possible.

Gradient magnetic field coils 2 comprising a cylindrical main coil 6 and a shield coil 7 are provided symmetrically with respect to the center plane 10 to the superconducting magnet 1 so as not to deteriorate openness of the magnetic circuit. Here, the main coil 6 has a cylindrical shape while the shield coil 7 has a cylindrical shape equipped with a flange round the outer periphery thereof as shown in FIG. 14. Since the shield coil 7 is so adapted as to cover the main coil 6, the occurrence of the eddy current in the conductor in the proximity of the gradient magnetic field coil 2 can be restricted.

To obtain openness, however, it is necessary to reduce the length in the direction of the depth (Z direction) of the apparatus as much as possible. To attain this object, the length of the gradient magnetic field coil 2 in the Z direction must be reduced, as well. To obtain a gradient magnetic field coil having sufficient performance (space linearity of the gradient magnetic field, generation efficiency of the gradient magnetic field and restriction of the eddy current), on the other hand, the length of the gradient magnetic field coil 2 in the Z direction must be elongated. Therefore, performance of the gradient magnetic field coil 2 must be limited if openness is to be improved.

U.S. Pat. No. 5,414,399 granted to Breneman et al. discloses an MRI apparatus using a superconducting magnet equipped with a pole piece for an opposed magnetic circuit.

As described above, it has been difficult to obtain a high performance gradient magnetic field coil suitable for a superconducting magnet for accomplishing a high magnetic field intensity and high openness and capable of satisfying required performance such as generation efficiency of a gradient magnetic field and restriction of an eddy current.

SUMMARY OF THE INVENTION

It is therefore a main object of the present invention to provide a gradient magnetic field coil capable of obtaining high performance satisfying the requirements described above even for a magnetic resonance imaging apparatus of an opposed magnetic circuit system having high openness.

The gradient magnetic field coil according to the present invention is used for a magnetic resonance imaging apparatus having a magnet for creating a homogeneous magnetic field area by a magnetic field from a magnetic field generation source accommodated in a cooling container and generating a static magnetic field in a predetermined direction, and includes a substantially flat coil group so extending as to orthogonally cross the direction of the magnetic field of the homogeneous magnetic field area, wherein the coil group includes a main coil for primarily generating a gradient magnetic field in the homogeneous magnetic field and a shield coil interposed between the main coil and the cooling container and generating a magnetic field which substantially cancels the magnetic field generated at an outside portion of the main coil close to the cooling container to zero.

The gradient magnetic field coil for use in a magnetic resonance imaging apparatus according to the present invention has a coil group including a main coil for primarily generating a gradient magnetic field and a shield coil interposed between the main coil and the cooling container, wherein two sets of cooling containers are so disposed as to oppose the direction of the homogeneous magnetic field, and the coil group is provided to each of the cooling containers.

DESCRIPTION OF THE PREFERRED EMBODIMENTS

Hereinafter, preferred embodiments of the present invention will be explained concretely with reference to the accompanying drawings.

Figure 1A:
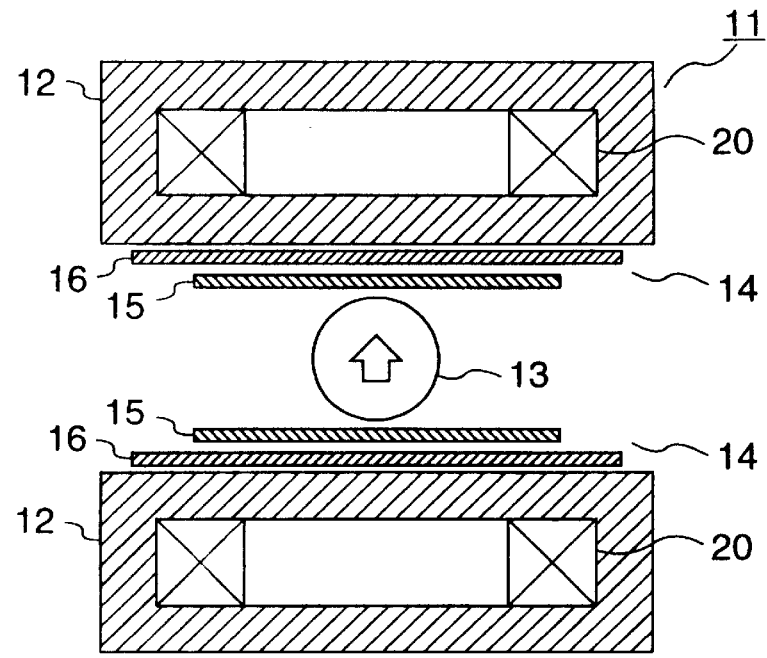
FIGS. 1A and 1B are a sectional view and an appearance view each showing a gradient magnetic field coil and a construction of a superconducting magnet to which the gradient magnetic field coil is applied, in the first embodiment of the invention.
Figure 1B:
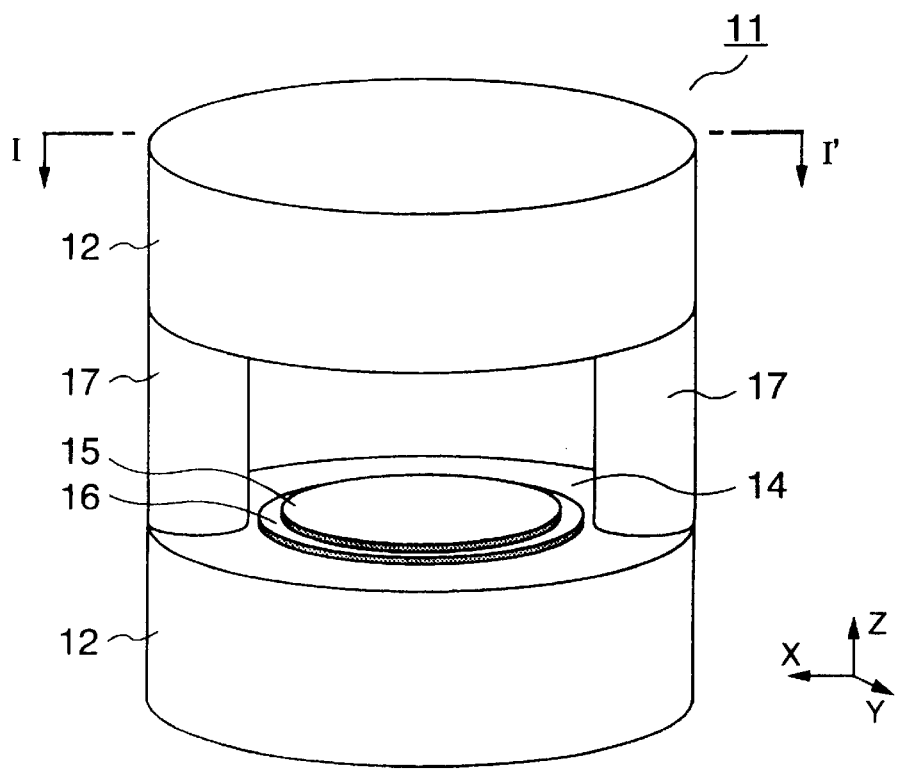

FIGS. 1A and 1B show a combination of a gradient magnetic field coil and a superconducting magnet to which the gradient magnetic field coil is applied according to the first embodiment of the present invention. FIG. 1A is a longitudinal sectional view taken along a line I-I' of FIG. 1B, which is an appearance view. In these drawings, the basic construction of a superconducting magnet 11 is the same as that of the third prior art example described already. Namely, it comprises a superconducting coil 20 for generating a static magnetic field and a cooling container 12 for cooling and retaining the coil 20 at a temperature at which predetermined superconducting characteristics can be acquired.

Though omitted in the drawings for the purpose of simplification, a structure is disposed for supporting the superconducting coil. Though not shown, further, the cooling container 12 comprises a liquid helium vessel for immersing the superconducting coil into liquid helium, a vacuum vessel for accommodating the whole assembly in order to prevent thermal convection and a heat shield for preventing thermal radiation. Incidentally, it is also possible to employ a system which directly cools the superconducting coil by a refrigerator and in such a case, the liquid helium vessel need not be used. Each superconducting coil is used under the state where it is accommodated in each cooling vessel.

The superconducting coils are accommodated inside the cylindrical container 12 and are disposed symmetrically with each other in the vertical direction in such a manner as to interpose a homogeneous magnetic field area 13 at the center of the superconducting magnet 11 between them. The upper and lower cooling vessels 12 are supported by poles 17 in such a manner as to keep a predetermined distance between them. Though these poles 17 play the functions of mechanically supporting the upper and lower cooling vessels 12, they may be provided further with a function of thermally connecting the liquid helium vessels inside the upper and lower cooling containers 12. According to this arrangement, the refrigerators (not shown) need not be provided to the upper and lower cooling containers 12, respectively, but only one refrigerator is sufficient for the whole system. The number of poles 17 is not particularly limited to two poles shown in the drawing, and can be increased to three or more. Alternatively, only one pole 17 may be used so as to obtain openness.

An apparatus having a wide opening can be constituted by employing the construction described above for the superconducting magnet. In this embodiment, iron is not disposed in the proximity of the gradient magnetic field coils for controlling homogeneity of the magnetic field as has been made in the second prior art example. In other words, since the problem of saturation of the magnetic flux in iron can be thus eliminated, excellent field homogeneity can be attained throughout a broad homogeneous magnetic field area even when the field intensity becomes high.

The gradient magnetic field coils 14 according to the present invention, too, are disposed symmetrically in the vertical direction with respect to the center plane of the homogeneous magnetic field area (which corresponds to an imaging space and is also the generation area of the gradient magnetic field) at the center of the apparatus. The set of the upper and lower gradient magnetic field coils 14 comprises a main coil 15 and a shield coil 16. The main coil 15 mainly functions to generate a predetermined gradient magnetic field in the homogeneous magnetic field area 13, and the shield coil 16 so functions as to generate a magnetic field which cancels the magnetic fields generated by the main coil 15 at positions spaced apart from the homogeneous magnetic field area 13 and to thereby prevent the magnetic field from leaking towards the superconducting magnet 11 (to the cooling container 12, etc.). Because the shield coil 16, too, generates the magnetic field in the homogeneous magnetic field area 13, the contribution of the shield coil 16 to the magnetic field must be taken into account in order to generate a predetermined magnetic field in the homogeneous magnetic field area 13.

In FIG. 1, both the main coil 15 and the shield coil 16 are depicted as one disk. As a matter of fact, however, both of them comprise three sets of gradient magnetic field coils corresponding to three directions of X, Y and Z. The current distribution (pattern) of each coil is selected so as to generate a predetermined gradient magnetic field in the homogeneous magnetic field area as described above and to restrict the intensity of the magnetic field leaking towards the superconducting magnet 11. This selection is made so that linearity of the gradient magnetic field to be generated in the homogeneous magnetic field area 13 becomes the best, the leaking magnetic field intensity becomes minimal, the gradient magnetic field intensity generated per unit current applied to the gradient magnetic field coil 14 becomes maximal and the inductance of the gradient magnetic field coil 14 becomes minimal. The optimization means using a computer for determining the current distribution satisfying the conditions described above may be used for the actual design as has been employed in the past for the cylindrical gradient magnetic field coil (for example, in the first prior art example).

Figure 13A:
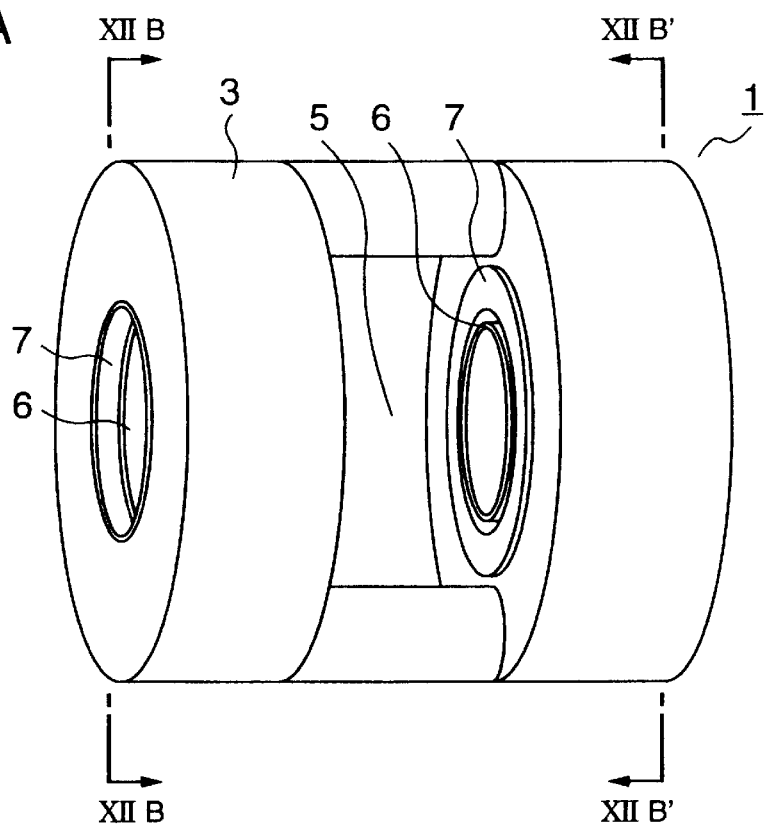
FIGS. 13A and 13B are an appearance view and a sectional view each showing a gradient magnetic field coil for use in a superconducting system opposed type magnetic circuit according to the third prior art example.
Figure 13B:
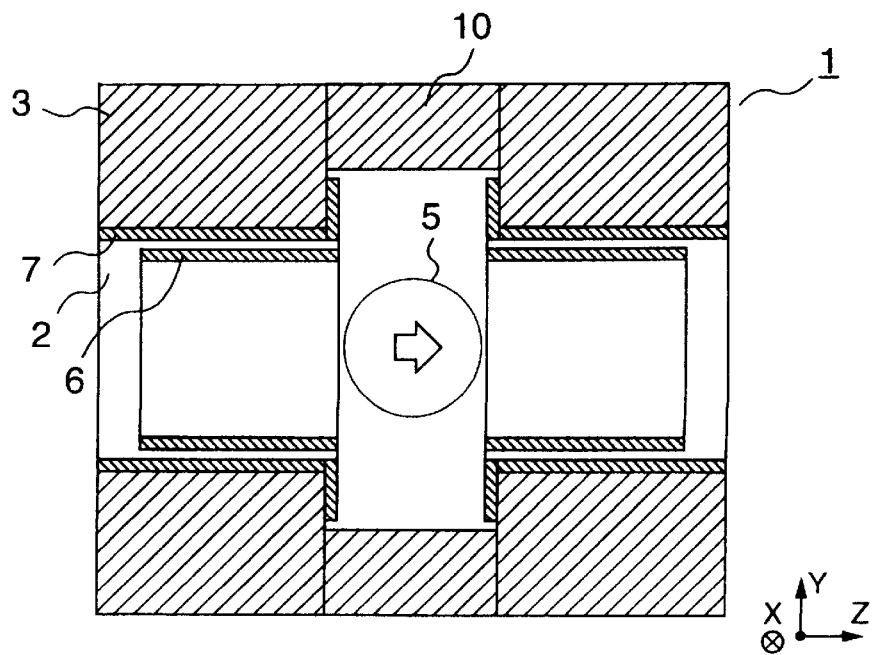
Figure 14:
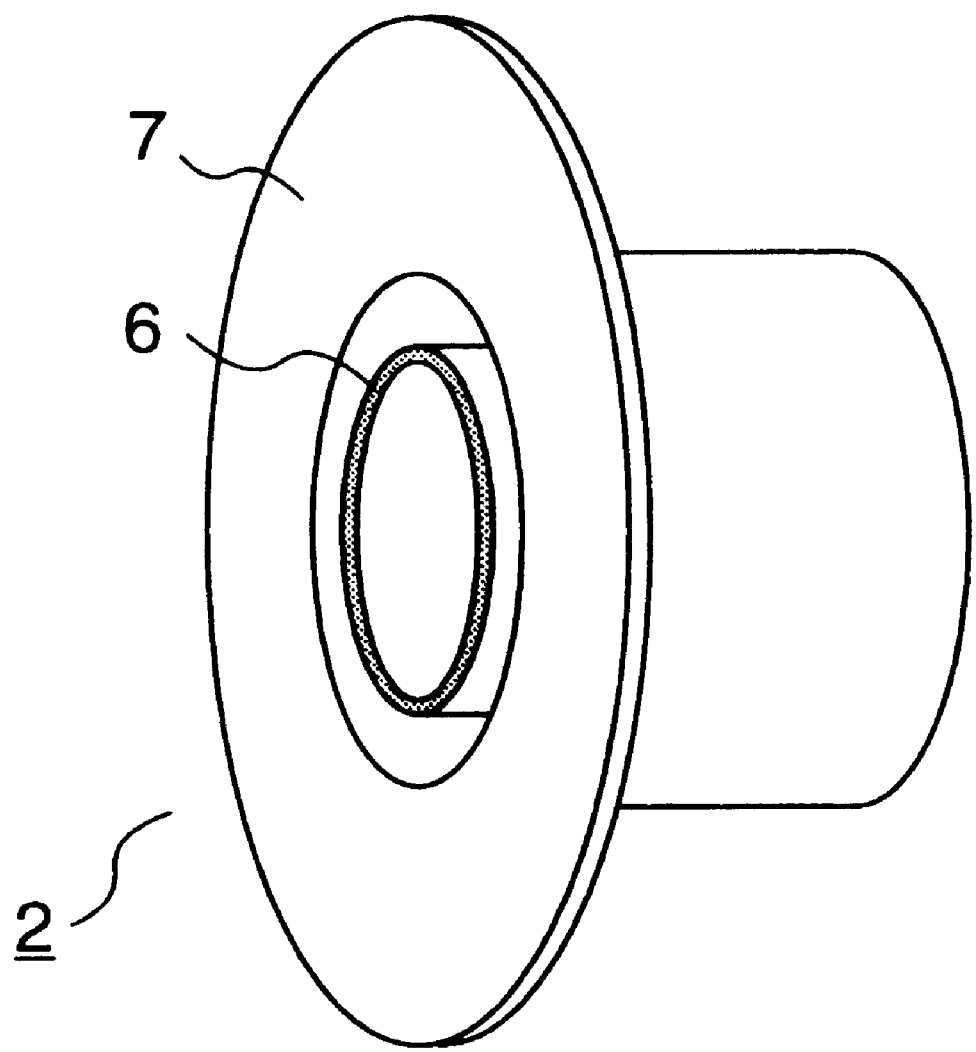
FIG. 14 is an appearance view of the gradient magnetic field according to the third prior art example.

The gradient magnetic field having high performance can be generated without deteriorating openness of the superconducting magnet 11 by using the gradient magnetic field coil 14 of this embodiment. Moreover, unlike the gradient magnetic field coil of the third prior art example (see FIGS. 13A and 13B), the length of the gradient magnetic field coil 14 in the Z direction is small because the coil 14 comprises a disk. Therefore, the length of the superconducting magnet 11 in the Z direction need not be increased in match with the length of the gradient magnetic field coil 14. Since the mean distance between the gradient magnetic field coil 14 and the homogeneous magnetic field area 13 is shorter than that of the third prior art example, generation efficiency of the magnetic field per unit current can be improved.

The superconducting magnet 11 is shown disposed vertically in FIG. 1, but the gradient magnetic field coil 14 according to the present invention can be used when the superconducting magnet 11 is disposed horizontally. Though the gradient magnetic field coils 14 in this embodiment have a symmetrical disk-like outer shape, they need not always have a symmetric shape to obtain necessary performance. For example, linearity of the gradient magnetic field distributions in one direction can be improved by using the elliptic shape for them.

Figure 8:
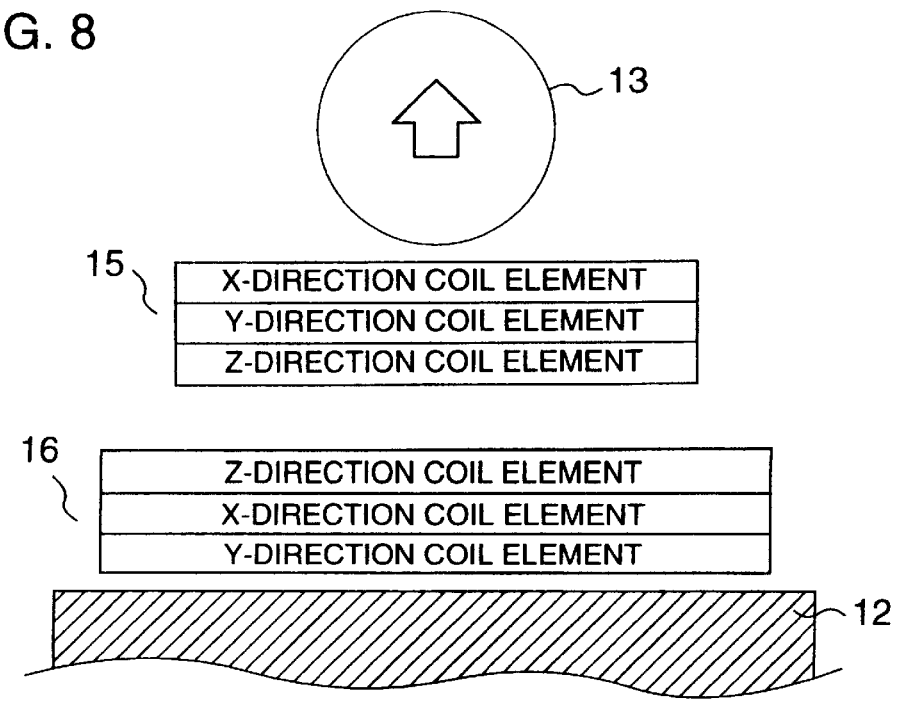
FIG. 8 is a sectional view useful for explaining a method of disposing the gradient magnetic field coil.
Figure 9:
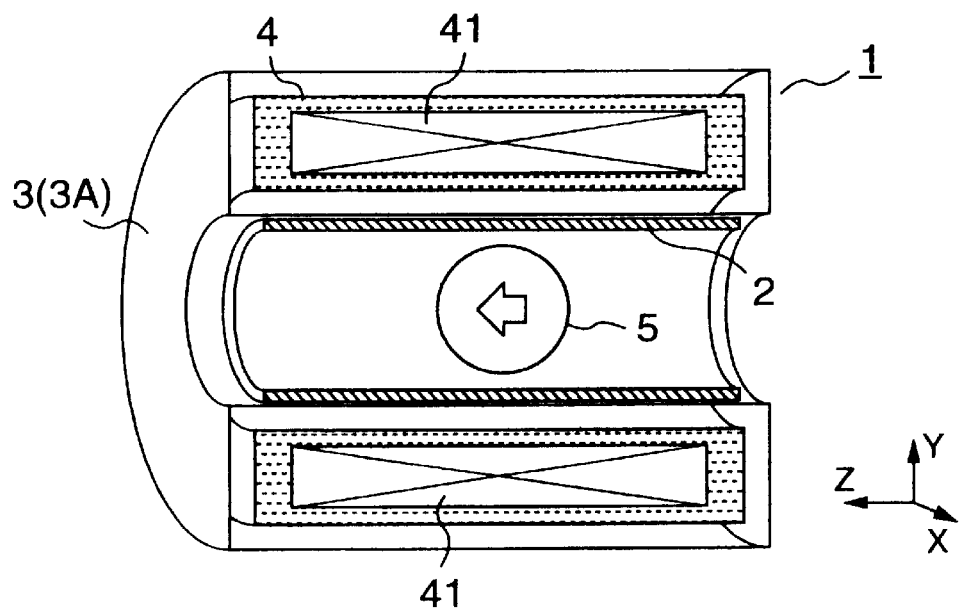
FIG. 9 is a sectional view showing a combination of a gradient magnetic field coil according to a first prior art example and a superconducting magnet of a horizontal magnetic field system.
Figure 10:
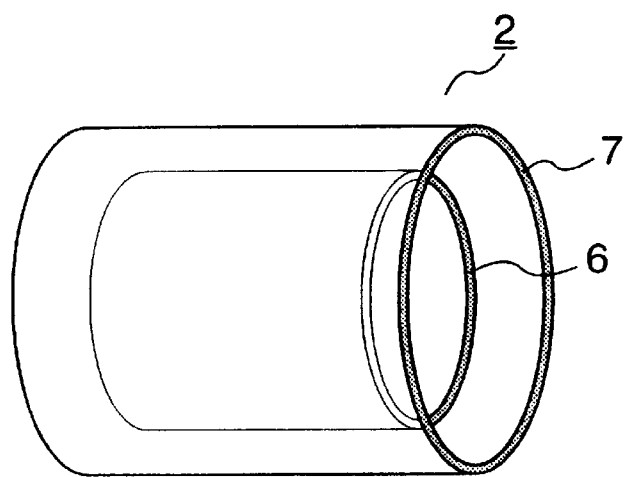
FIG. 10 is an appearance view of the gradient magnetic field according to the first prior art example.
Figure 11:
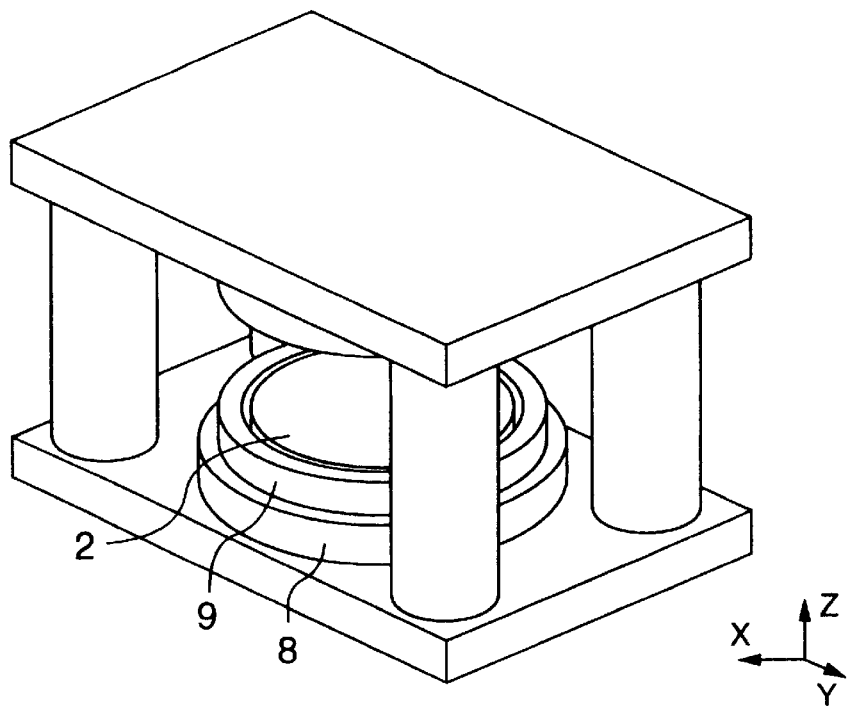
FIG. 11 is a perspective view showing a combination of a gradient magnetic field coil according to a second prior art example and an opposed type magnetic circuit using a permanent magnet.
Figure 12A:
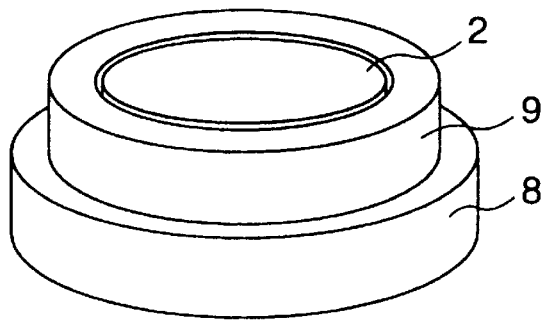
FIGS. 12A and 12B are an appearance view and a sectional view each showing the gradient magnetic field coil according to the second prior art example.
Figure 12B:
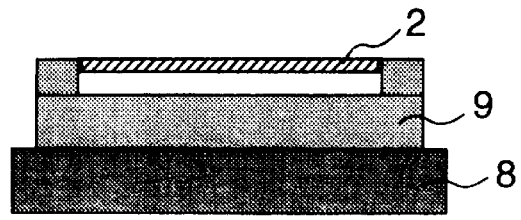

The sequence of the disposition of the X direction gradient magnetic field coil element, the Y direction gradient magnetic field coil element and the Z direction gradient magnetic field coil element as the constituent elements of the gradient magnetic field coil 14 in the Z direction is arbitrary. However, it is generally the best to dispose the Z direction gradient magnetic field coil, the pattern shape of which is simple and which has high current efficiency, at the position having the severest condition from the aspect of the overall balance. In other words, as shown in FIG. 8, the X direction coil element, the Y direction coil element and the Z direction coil element are disposed in the order named from the side close to the homogeneous magnetic field area 13 for the main coil 15, and the coil elements are disposed in the order of Z, X and Y for the shield coil 16. According to this arrangement, current efficiency of the X and Y direction coil elements having lower current efficiency than the Z direction coil element can be improved.

Figure 2:
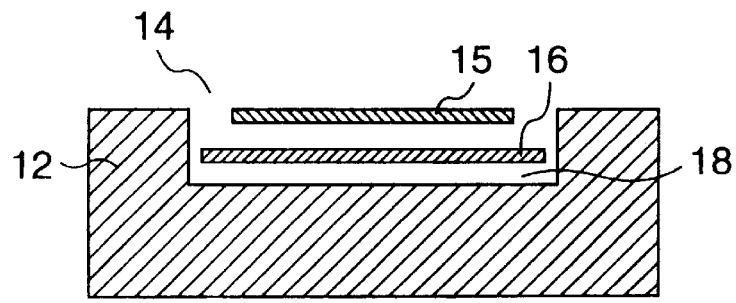
FIG. 2 is a sectional view showing a combination of the gradient magnetic field coil and the superconducting magnet according to the second embodiment of the invention.

FIG. 2 shows the combination of the gradient magnetic field coil and the superconducting magnet according to the second embodiment of the present invention. Since the combinations are symmetric in the vertical direction, FIG. 2 shows only the lower portion. In this embodiment, a recess 18 is defined at the center of the surface of the cooling container 12 of the superconducting magnet 11 facing the homogeneous magnetic field area 13, and the main coil 15 and the shield coil 16 of the gradient magnetic field coil 14 are disposed in this recess 18. Assuming that the distance between the upper and lower gradient magnetic field coils 14 is the same as that of the first embodiment, the opposed distance of the side edge portions of the superconducting magnet 11 can be made closer than in FIG. 1. In other words, the opposed distance between the superconducting coils having a large diameter as the principal constituent of the superconducting magnet 11 can be reduced. Generally, to obtain the superconducting magnet 11 generating high field homogeneity, a large current must be caused to flow through this superconducting coil portion having a large diameter, and the greater the opposed distance between the coils, the more drastically increases this current quantity. Therefore, the total magnetomotive force of the superconducting magnet 11 can be drastically reduced by reducing the opposed distance of the superconducting coils and the production cost of the superconducting coils can be reduced, as well.

The shape of the recess 18 and its depth are determined in accordance with the shape of the gradient magnetic field coil 14 and its arrangement dimension in this embodiment and at the same time, the shape and the size of the superconducting coil to be accommodated in the cooling container 12 must also be taken into consideration. Generally, the shape of the recess 18 is circular in the same way as the gradient magnetic field coil 14. The depth of the recess 18 is preferably such that the gradient magnetic field coil 14 can be accommodated in the recess 18 as a whole, but the object of reducing the opposed distance between the superconducting coils can be accomplished even when the depth of the recess 18 is such that only a part of the coil 14 can be accommodated.

Figure 3:
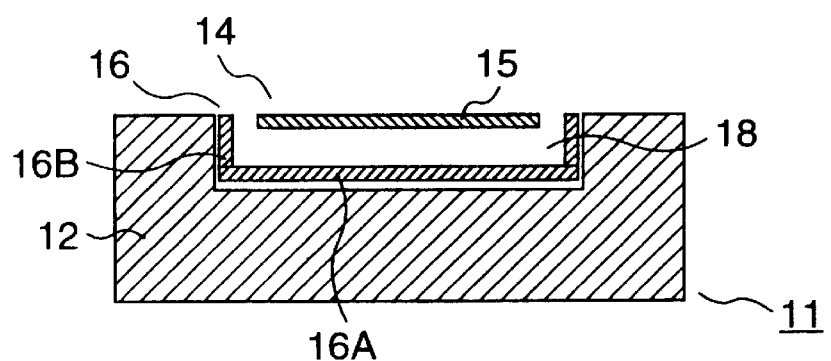
FIG. 3 is a sectional view showing a combination of the gradient magnetic field coil and the superconducting magnet according to the third embodiment of the invention.

FIG. 3 shows the combination of the gradient magnetic field coil and the superconducting magnet according to the third embodiment of the present invention. In addition to the construction of the embodiment shown in FIG. 2, this embodiment adds a short cylindrical shield coil 16B to the outer periphery of the disk-like shield coil 16A of the shield coil 16. When this cylindrical shield coil 16B is added, the leak of the magnetic field by the main coil 16 in the transverse direction can be prevented, and the occurrence of the eddy current in the cooling container 12, etc., can be further restricted.

In the third embodiment shown in FIG. 3, the main coil 15 is shown positioned at the same position as the end portion of the cylindrical shield coil 16B. When the main coil 15 is disposed at a deeper position than the end position of this cylindrical shield coil 16B, however, the leakage magnetic field that leaks to the outer area from the diameter of the shield coil 16B, can be restricted. However, the main coil 15 must not be disposed at an excessively deep position because generation efficiency of the gradient magnetic field is deteriorated.

Figure 4:
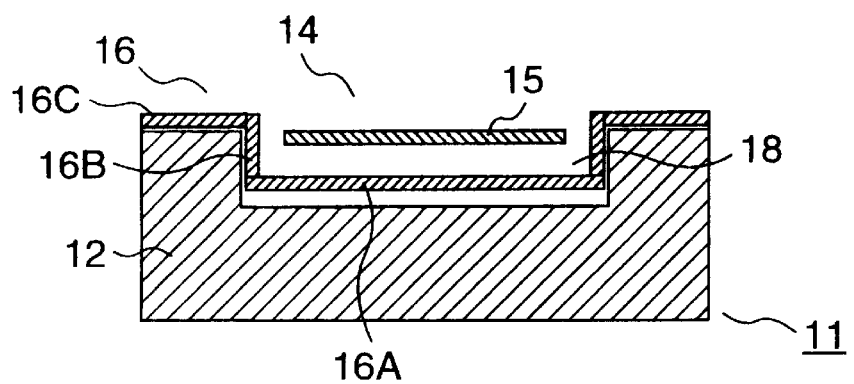
FIG. 4 is a sectional view showing a combination of the gradient magnetic field coil and the superconducting magnet according to the fourth embodiment of the invention.

FIG. 4 shows the combination of the gradient magnetic field coil and the superconducting magnet according to the fourth embodiment of the present invention. In addition to the construction of the embodiment shown in FIG. 3, a disk-like shield coil 16C having an opening at its center and a large diameter is added to the outer periphery of the cylindrical shield coil 16B of the shield coil 16. The inner diameter of the shield coil 16C is equal to the outer diameter of the cylindrical shield coil 16B and the shield coil 16C keeps contact with the end surface on the side close to the cylindrical homogeneous magnetic field area 13. Because the shield coil 16C is added in such a manner as to cover the opposed surface of the outer peripheral portion of the cooling container 12 of the superconducting magnet 11, shield can be effected up to the area of the conductor existing at the outer peripheral portion of the superconducting magnet 11, and the restriction effect of the eddy current resulting from the leakage magnetic field can be further improved.

Figure 5A:
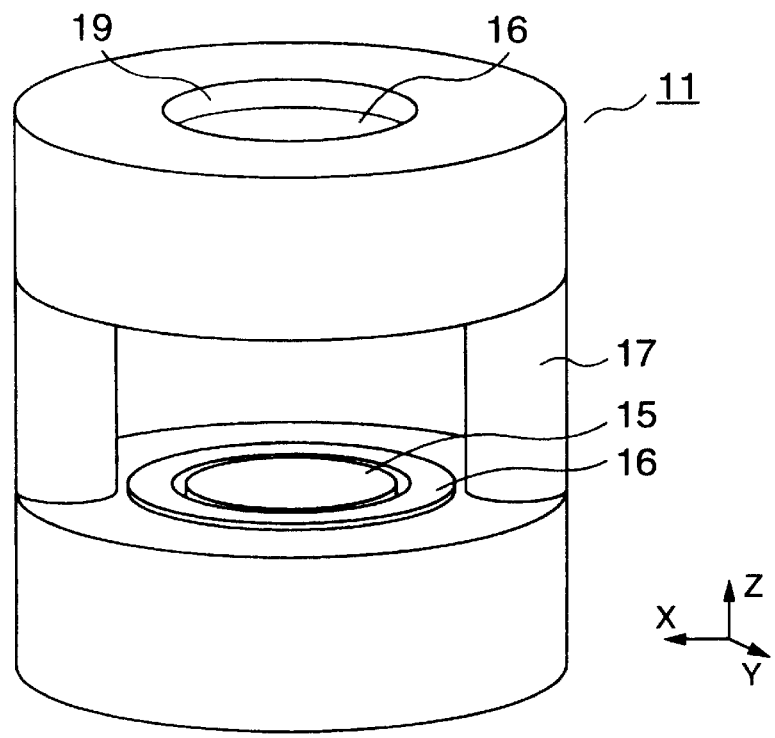
FIGS. 5A and 5B are a perspective view and a sectional view each showing the case where the gradient magnetic field coil according to the fourth embodiment is applied to a superconducting magnet corresponding to a third prior art example.
Figure 5B:
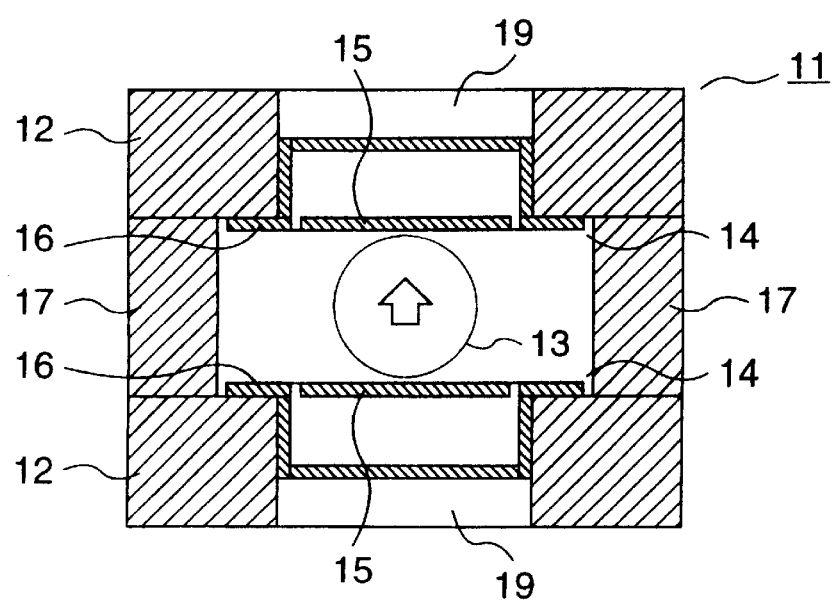
Figure 6:
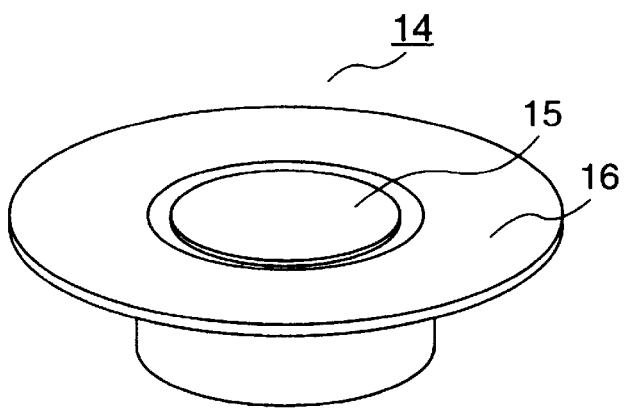
FIG. 6 is an appearance view of the gradient magnetic field coil used in the embodiment shown in FIG. 5.

FIGS. 5A and 5B are sectional views of the construction wherein the gradient magnetic field coil of the fourth embodiment is applied to the superconducting magnet of an opposed type magnetic circuit. In this superconducting magnet 11, the cooling containers 12 have a doughnut shape and are disposed at upper and lower positions. The center portion 19 of the cooling container 12 is a hollow portion. Because the gradient magnetic field coil 14 is accommodated in this hollow portion 19, the homogeneous magnetic field area 13 can be secured more broadly. FIG. 6 shows the appearance of the gradient magnetic field coil shown in FIG. 5. When this embodiment is compared with the gradient magnetic field coil according to the prior art example shown in FIG. 13, the present embodiment has the advantage that the depth can be reduced. Therefore, because the depth of the superconducting magnet 11 can be reduced, too, as shown in FIG. 5, the size of the apparatus can be reduced as a whole, and this embodiment is effective for mitigating the threatening feeling to the subject and for reducing the installation condition of the apparatus.

Figure 7:
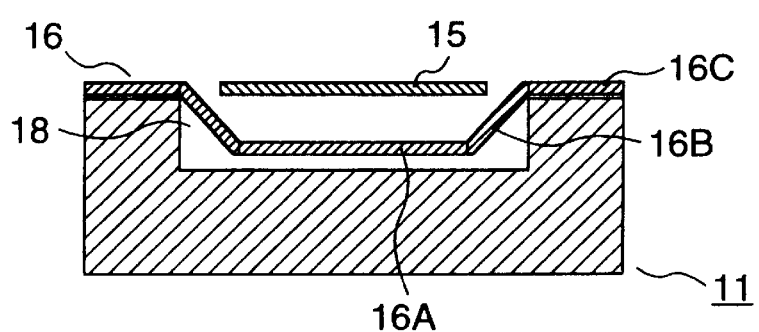
FIG. 7 is a sectional view showing a combination of the gradient magnetic field coil and the superconducting magnet according to the fifth embodiment of the invention.

FIG. 7 shows the combination of the gradient magnetic field coil and the superconducting magnet according to the fifth embodiment of the present invention. In this embodiment, the portion of the short cylindrical shield coil 16B of the embodiment shown in FIG. 4 is replaced by a cone-like shield coil. Because the shape is changed in this way, the disk-like shield coil 16A at the center portion and the bored disk-like shield coil 16C at the outer peripheral can be connected easily, so that the production of the gradient magnetic field coil 14 can be made easier.

The modification of the shape of the short cylindrical shield coil 16B into the cone shape can be applied to the third embodiment, too, and in such a case, too, the production of the gradient magnetic field coil 14 can be made easier.

The foregoing explanation has been given limitedly to the case where the gradient magnetic field coil according to the present invention is applied to the superconducting magnet. However, the application of the gradient magnetic field coil according to the present invention is not particularly limited to the superconducting magnet, and the gradient magnetic field coil can be similarly applied to those apparatuses which use normal conducting magnets or permanent magnets so long as they are analogous to the superconducting magnet described above.

As described above, the present invention can provide the gradient magnetic field coil suitable for the superconducting magnet having high openness. When the gradient magnetic field coil of the present invention is applied to a magnetic resonance imaging apparatus, the apparatus having high openness and capable of acquiring quality images can be obtained.

What is claimed is:

1. A magnetic resonance imaging including a magnet for generating a homogeneous magnetic field area by a magnetic field from a magnetic field generation source generating a static magnetic field in a predetermined direction and a pair of gradient magnetic field coils generating a gradient magnetic field in said homogeneous magnetic field area, wherein each of said pair of gradient magnetic field coils includes a main coil and a shield coil, said main coil has a flat surface extending perpendicular to the direction of said static magnetic field, and said shield coil has a flat surface extending perpendicular to the direction of said static magnetic field, said flat surfaces of said main coil and said shield coil extending in parallel to one another, each of said pair of the gradient magnetic field coils is aligned with the direction of the magnetic field at said homogeneous magnetic field area, and said pair of the gradient magnetic field coils are arranged to sandwich said homogeneous magnetic field area therebetween.

2. A magnetic resonance imaging apparatus according to claim 1, wherein said main and shield coils of one gradient magnetic field coil and said main and shield coils of an other gradient magnetic field coil are disposed symmetrically with respect to a center of the magnetic field of said homogeneous magnetic field area.

3. A magnetic resonance imaging apparatus according to claim 1, wherein a pair of magnetic field generation sources are provided, said pair of magnetic field sources being opposed to one another with a space therebetween for generating the static magnetic field in the predetermined direction from one of said pair of magnetic field generation sources to another of said pair of magnetic field generation sources so as to form said homogeneous magnetic field area, said pair of gradient magnetic field coils being opposed to one another and spaced so as to have said homogeneous magnetic field area interposed therebetween for generating the gradient magnetic field in said homogeneous magnetic field area with an intensity which varies in said homogeneous magnetic field area and in a direction from one of said pair of gradient magnetic field coils to the other of said pair of gradient magnetic field coils, said main coil being spaced from said shield coil by a predetermined distance, said main coil be disposed at a position close to said homogeneous magnetic field area, said main coil being formed in a planar disk shape extending perpendicular to said static magnetic field and said shield coil being formed so as to have an edge of circular shape and a planar surface extending parallel with a planar surface of said planar disk shape main coil, said shield coil generating a magnetic field which cancels a magnetic field generated on a surface of said main coil facing away from the opposing main coil.

4. A magnetic resonance imaging apparatus according to claim 3, wherein said pair of gradient magnetic field coils are arranged to be perpendicular to the direction of said static magnetic field generated by said pair of magnetic field sources.

5. A magnetic resonance imaging apparatus according to claim 3, wherein said main and shield coils are disposed symmetrically with respect to a center of said homogeneous magnetic field area.

6. A magnetic resonance imaging apparatus comprising:
a pair of cooling containers having flat surfaces spaced from one another and opposed to each other across the space;
a pair of superconducting type magnetic field sources contained in said cooling containers, for generating a homogeneous magnetic field in a direction from one of said coils to the other one of said coils in said space between said flat surfaces;
a pair of gradient magnetic field coils opposed to each other across said homogeneous magnetic field between said opposed surfaces of said cooling container for generating a gradient magnetic field in a direction from one of said gradient magnetic field coils to the other one of said gradient magnetic field coils, said gradient magnetic field varying in said homogeneous magnetic field, each of said gradient magnetic field coils having a flat surface extending perpendicular to a direction of a static magnetic field; and
each of said gradient magnetic field coils including a main coil and a separate shield coil disposed with a predetermined distance therebetween, said main coil being disposed at a position which is close to said homogeneous magnetic field and generating said gradient magnetic field, said shield coil being disposed between said main coil and said cooling container and generating a magnetic field which substantially cancels the magnetic field generated by said main coil between said main coil and said cooling container.

7. A magnetic resonance imaging apparatus according to claim 6, wherein each of said main coils and said shield coils of said gradient magnetic field coils includes an x-direction coil element, a y-direction coil element and a z-direction coil element for generating gradient magnetic fields in the directions of x, y and z which are perpendicular to each other, said x, y and z direction coil elements of said main coil being arranged in an order of x, y and z from a position close to said homogeneous magnetic field, and said x, y and z direction coil elements of said shield coil being arranged in an order of z, x and y from a position close to said homogeneous magnetic field.

8. A magnetic resonance imaging apparatus comprising:
a pair of cooling containers having flat surfaces spaced from one another and opposed to each other across the space;
a pair of superconducting type magnetic field sources contained in said cooling containers, for generating a homogeneous magnetic field in a direction from one of said coils to the other one of said coils in said space between said flat surfaces;
a pair of gradient magnetic field coils opposed to each other across said homogeneous magnetic field between said opposed surfaces of said cooling container for generating a gradient magnetic field in a direction from one of said gradient magnetic field coils to the other one of said gradient magnetic field coils, said gradient magnetic field varying in said homogeneous magnetic field;
each of said gradient magnetic field coils including a main coil and a separate shield coil disposed with a predetermined distance therebetween, said main coil being disposed at a position which is close to said homogeneous magnetic field, said shield coil being disposed between said main coil and said cooling container;
said main coil being formed in a flat shape with a surface extending perpendicular to a direction of a static magnetic field and generating said gradient magnetic field;
said shield coil being formed in a flat shape with a surface extending perpendicular to the direction of the static magnetic field and generating a magnetic field which substantially cancels the magnetic field generated by said main coil between said main coil and said cooling container; and
each of said cooling containers having a recess with a predetermined depth at a center portion on the opposed surfaces thereof, and one of said pair of gradient magnetic coils being disposed in said recess.

9. A magnetic resonance imaging apparatus according to claim 8, wherein a surface of said main coil is flush with said surface of said cooling container.

10. A magnetic resonance imaging apparatus according to claim 9, wherein said shield coil further includes a first shield coil element and a second shield coil element disposed around an outer periphery of said first shield coil, said first shield coil covering a bottom surface of said recess, and said second shield coil element covering a side wall of said recess.

11. A magnetic resonance imaging apparatus according to claim 10, wherein said shield coil further includes a third shield coil element disposed around an outer periphery of said second shield coil element and covering a part of said surface of the cooling container.

12. A magnetic resonance imaging apparatus according to claim 11, wherein each of said cooling containers has a doughnut shape having a cylindrical space as the recess in the center thereof, and said shield coil is disposed in said cylindrical space.

13. A magnetic resonance imaging apparatus according to claim 10, wherein said second shield coil element is slanted with respect to the first shield coil element.

14. A magnetic resonance imaging apparatus according to claim 11, wherein said second shield coil element is slanted with respect to the first shield coil element.

15. A magnetic resonance imaging apparatus according to claim 12, wherein said second shield coil element is slanted with respect to the first shield coil element.

16. A gradient magnetic field coil for use in a magnetic resonance imaging apparatus including a magnet for generating a homogeneous magnetic field area by a magnetic field from a magnetic field generation source generating a static magnetic field in a predetermined direction, wherein said gradient magnetic field coil includes a main coil and a shield, said main coil has a flat surface extending perpendicular to the direction of said static magnetic field, said shield coil has a flat surface extending perpendicular to the direction of said static magnetic field, and said flat surfaces of main coil and shield coil extends in parallel to one another.

* * * * *